US010679698B2

(12) United States Patent
Damle et al.

(10) Patent No.: US 10,679,698 B2
(45) Date of Patent: Jun. 9, 2020

(54) MEMORY PRESET ADJUSTMENT BASED ON ADAPTIVE CALIBRATION

(71) Applicant: Intel Corporation, Santa Clara, CA (US)

(72) Inventors: Prashant S. Damle, Portland, OR (US); Wei Fang, El Dorado Hills, CA (US); Albert Fazio, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 121 days.

(21) Appl. No.: 15/939,026

(22) Filed: Mar. 28, 2018

(65) Prior Publication Data

US 2019/0043571 A1  Feb. 7, 2019

(51) Int. Cl.
| | | |
|---|---|---|
| *G11C 11/00* | (2006.01) | |
| *G11C 13/00* | (2006.01) | |
| *G06F 13/40* | (2006.01) | |
| *G06F 13/16* | (2006.01) | |
| *G11C 29/02* | (2006.01) | |
| *G11C 29/50* | (2006.01) | |
| *G11C 29/52* | (2006.01) | |
| G11C 29/44 | (2006.01) | |
| G11C 29/04 | (2006.01) | |

(52) U.S. Cl.
CPC ........ *G11C 13/004* (2013.01); *G06F 13/1668* (2013.01); *G06F 13/4068* (2013.01); *G11C 13/0035* (2013.01); *G11C 13/0069* (2013.01); *G11C 13/0097* (2013.01); *G11C 29/021* (2013.01); *G11C 29/028* (2013.01); *G11C 29/50* (2013.01); *G11C 29/52* (2013.01); *G11C 13/0004* (2013.01); *G11C 2029/0409* (2013.01); *G11C 2029/4402* (2013.01); *G11C 2029/5006* (2013.01); *G11C 2213/71* (2013.01); *G11C 2213/77* (2013.01)

(58) Field of Classification Search
CPC ............ G11C 13/0004; G11C 13/0069; G11C 13/004; G11C 13/0007; G11C 2213/72; G11C 2213/79; G11C 13/0002; G11C 13/003; G11C 2013/0073; G11C 11/5685; G11C 2013/0054; G11C 11/5678; G11C 2213/76; G11C 2213/32; G11C 2213/74
See application file for complete search history.

(56) References Cited

U.S. PATENT DOCUMENTS

| | | |
|---|---|---|
| 8,510,636 B2 | 8/2013 | Ruby et al. |
| 2008/0205163 A1 | 8/2008 | Park et al. |
| 2012/0254699 A1 | 10/2012 | Ruby et al. |

(Continued)

OTHER PUBLICATIONS

Extended European Search Report for Patent Application No. 19157045.6, dated Jul. 30, 2019, 9 pages.

*Primary Examiner* — Hien N Nguyen
(74) *Attorney, Agent, or Firm* — Compass IP Law PC

(57) ABSTRACT

A memory device includes a memory array having multiple nonvolatile memory cells that stores data as a set or a reset state of the memory cells. The nonvolatile memory cells can be resistance-based memory, which stores data based on resistive state of the memory cells. A controller coupled to the memory array periodically samples set and reset margins for memory cells of the memory array. Responsive to detection of a change in a margin, the system can adaptively adjust a preset electrical setting used to differentiate between a set state and a reset state.

23 Claims, 8 Drawing Sheets

(56) References Cited

U.S. PATENT DOCUMENTS

| | | | |
|---|---|---|---|
| 2012/0314478 A1* | 12/2012 | Ha | G11C 8/10 365/148 |
| 2012/0314499 A1 | 12/2012 | Yuan et al. | |
| 2014/0043898 A1 | 2/2014 | Kuo et al. | |
| 2014/0281149 A1* | 9/2014 | Roberts | G06F 12/023 711/103 |
| 2016/0170871 A1 | 6/2016 | Hyun et al. | |
| 2016/0179406 A1 | 6/2016 | Gorobets et al. | |
| 2017/0186471 A1 | 6/2017 | Qawami et al. | |
| 2017/0235681 A1* | 8/2017 | Kaburaki | G06F 12/0292 711/128 |
| 2017/0236580 A1 | 8/2017 | Chu et al. | |
| 2017/0271031 A1 | 9/2017 | Sharon et al. | |
| 2017/0287533 A1 | 10/2017 | Jeyasingh et al. | |
| 2017/0372780 A1 | 12/2017 | Qawami et al. | |
| 2019/0004893 A1 | 1/2019 | Kwok et al. | |
| 2019/0043571 A1* | 2/2019 | Damle | G11C 13/004 |
| 2019/0103160 A1 | 4/2019 | Fang et al. | |

* cited by examiner

MEMORY PRESET ADJUSTMENT BASED ON ADAPTIVE CALIBRATION

FIELD

Descriptions are generally related to memory subsystems, and more particular descriptions are related to calibration of electrical settings for a resistive-based memory.

BACKGROUND

There is an increased interest in nonvolatile memory that operates in conjunction with the volatile main system memory. Volatile memory has an indeterminate state when power is interrupted to it, and nonvolatile memory maintains its state even when power is interrupted. Nonvolatile memory is typically slower to access than volatile memory, with traditional nonvolatile memory having access speeds that are at least an order of magnitude slower than the volatile system memory. Recent developments in resistive-based memory devices provide memory that is nonvolatile and has access speeds that are comparable to the access speeds of volatile memory, instead of orders of magnitude slower.

Resistive-based nonvolatile memory can degrade over time. As the cells are cycled, the behavior of the device can change. In particular, the electrical setting characteristics will change over the life of the memory device, such as the access voltage levels or currents. There are margins between a particular electrical setting and the value needed to cause the access desired. Those margins can shift over time, which will cause the presets or trim values to not be effective.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
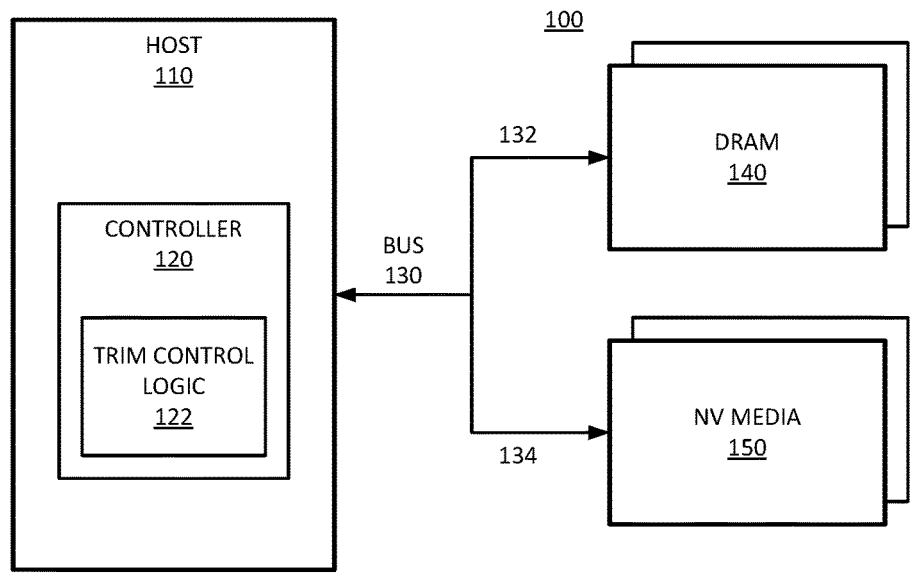
FIG. 1 is a block diagram of an example of a memory subsystem with adaptive trim control logic to set trim for the nonvolatile media.

Descriptions of certain details and implementations follow, including non-limiting descriptions of the figures, which may depict some or all examples, and well as other potential implementations.

DETAILED DESCRIPTION

A memory device includes a memory array having multiple resistance-based memory cells. Resistance-based memory stores data based on resistive state, either set or reset, of the memory cells. The electrical setting margins, such as read voltage write current, or other voltage and current values, can adjust over the life of the device. A controller in the system can provide adaptive calibration of the electrical setting margins to reduce the bit error rate that would otherwise tend to increase over the life of the memory device. The controller is coupled to the memory array, and can periodically sample set and reset margins for memory cells of the memory array. Responsive to detection of a change in a margin, the system can adaptively adjust a preset electrical setting used to differentiate between a set state and a reset state.

Such a system enables the calibration of a memory channel to a nonvolatile memory device in the field. Thus, the system can adjust the trims or preset values, for example, for one or more read voltages or one or more write currents or other setting, in real-time. The realtime adjustments can adjust the bit error rate at any point in the life of the memory media. In one example, the system operates with firmware in a controller that periodically samples the margins of interest, and can increase or decrease the electrical setting depending on whether a margin crosses a pre-determined fail threshold.

Nonvolatile memory can refer to memory that does not lose state or become indeterminate when power is interrupted. Traditionally there has been significant use of flash-based memory or NAND memory, which refers to nonvolatile memory devices that store data based on electrical charge. The nonvolatile memory referred to herein can be or include memory that is resistive or resistance based. Such memory stores data based on a state of the memory device changes a resistance of memory cell based on whether the cell stores a one or a zero. For example, three-dimensional crosspoint (3DXP) memory devices, phase change memories, memristor memory, or other memories or a combination store data based on how much resistance is seen at the memory cell, or how well it conducts current. The sampling-based calibration herein can also apply to NAND memory or other charge-based memory in addition to resistive based memory. Examples provided throughout refer to resistive based memory, but can also apply to sampling based calibration for charge based memory.

Traditional calibration for nonvolatile flash memories can include a dynamic demarcation voltage approach, where margins are dynamically changed based on reaching access thresholds (e.g., change a margin in response to a certain number of reads and writes occur. However, not all resistive based memory responds the same over the life of the device, and even different batches of memory made by the same process can have different characteristics. Thus, adaptive calibration based on periodic sampling can provide a more accurate response to the actual operation of the memory device. Additionally, in one example, the system can keep different preset values for different dies or chips based on individual operation.

The traditional dynamic calibration relies on fixed cycle counts to adjust electrical characteristics. However, process changes or even operating conditions of a device can cause a fixed cycle count approach to actually introduce changes that result in sub-optimal performance, which can increase the error rate. Sampling-based calibration responds to the actual runtime behavior of a device. Additionally, sampling-based calibration can provide improvements or optimizations for individual dies, which can reduce or minimize the die to die variability impact. Traditional dynamic calibration can optimize one margin over another. Instead of reacting only to the number of accesses, the adaptive calibration herein can provide calibration for various different electrical settings based on measurement, which addresses the overall behavior of the device instead of individual electrical settings.

FIG. 1 is a block diagram of an example of a memory subsystem with adaptive trim control logic to set trim for the nonvolatile media. System 100 includes host 110 coupled to DRAM 140 and NV (nonvolatile) media 150 over one or more buses 130. Host 110 represents a primary system to which DRAM 140 and NV media 150 are coupled.

Host 110 can be or include a hardware and software platform for system 100. A hardware platform includes the hardware components such as the processor, interconnect hardware, support components, boards, or other hardware. A software platform includes a host operating system, firmware of the hardware platform, drivers, or other software that provides the general control and functionality of or interfacing with the hardware platform. Programs and other applications that interface with a user or execute on user data operate under the software platform.

In one example, host 110 includes controller 120, which can represent one or more controller components to interface with DRAM 140 or NV media 150 or both. In one example, NV media 150 is byte addressable as is DRAM 140, and a single memory controller can interface with both memory types. DRAM 140 represents volatile memory, and can be any type of traditional volatile dynamic random access memory (DRAM), which is traditionally used as main system memory for system 100. DRAM 140 stores data for operational use in system 100, for programs that are "loaded" from nonvolatile storage. NV media 150 represent nonvolatile byte addressable memory, and can store similar data to DRAM 140. However, access times for NV media 150 are typically slower than access times for DRAM 140.

Bus 130 can represent a memory bus for main system memory of system 100. In one example, bus 130 is separated as separate channels. Separate channels refer to a group of signal lines that provide access to one or more memory devices or dies. Separate channels can be operated independently of each other. Thus, controller 120 can drive or receive data on one channel separately from another channel. In one example, bus 130 includes one or more channel 132 for volatile DRAM 140 and one or more channel 134 for NV media 150.

In one example, controller 120 executes firmware to manage the margin calibration for NV media 150. Such firmware may be the same as firmware that controls electrical settings for DRAM 140, or can be separate firmware, meaning that controller 120 executes separate firmware routines to control electrical settings for NV media 150 and to control electrical settings for DRAM 140. In one example, the firmware that controls electrical settings for NV media 150 can be the same firmware that controls calibration. In one example, different firmware routines can control the electrical settings for NV media 150, and another routine for calibration of margin presets for NV media 150.

In one example, the firmware that controls calibration for NV media 150 executes an algorithm to periodically sample margins for set and reset states of the memory cells. In one example, set refers to a logic one, and can refer to a structured or organized resistive state. Typically such a state results in lower resistance. In such an implementation, reset can refer to a logic zero, and refer to a less structured resistive state, which results in higher resistance. In one example, the calibration samples margins for set and reset, and can increase or decrease a preset for an electrical setting (e.g., an access voltage such as read Vdm (demarcation voltage) or access current such as write current (e.g., program current for set or program current for reset)) depending on whether the set or reset margins cross a predetermined fail threshold.

In one example, NV media 150 includes a 3DXP memory device. The electrical performance or behavior of the device can change over the life of the device with the cycling of the memory cells. However, such a device or other resistive based devices can behave differently at different thresholds of cycling. For example, for a device having a maximum of approximately 100K cycles, some devices may start behaving differently or responding to different read voltage levels, as an example, at 30K cycles where others would not show the same behavior until 50K cycles.

In one example, 3DXP performs pre-cycling in operation, which can result in write cycling that will change the read voltage threshold. Post cycling on a NAND device does not result in the same effect, and can be addressed with traditional dynamic calibration. The sampling based calibration can address the shifts for 3DXP, where the set and reset distributions can shift down over time. The calibration can read the change in distributions based on monitoring error thresholds, and correspondingly shift the read voltage down between set distribution and reset distribution to adjust the margins. In one example, the change in distributions can be determined by monitoring read retry rate.

Figure 2:
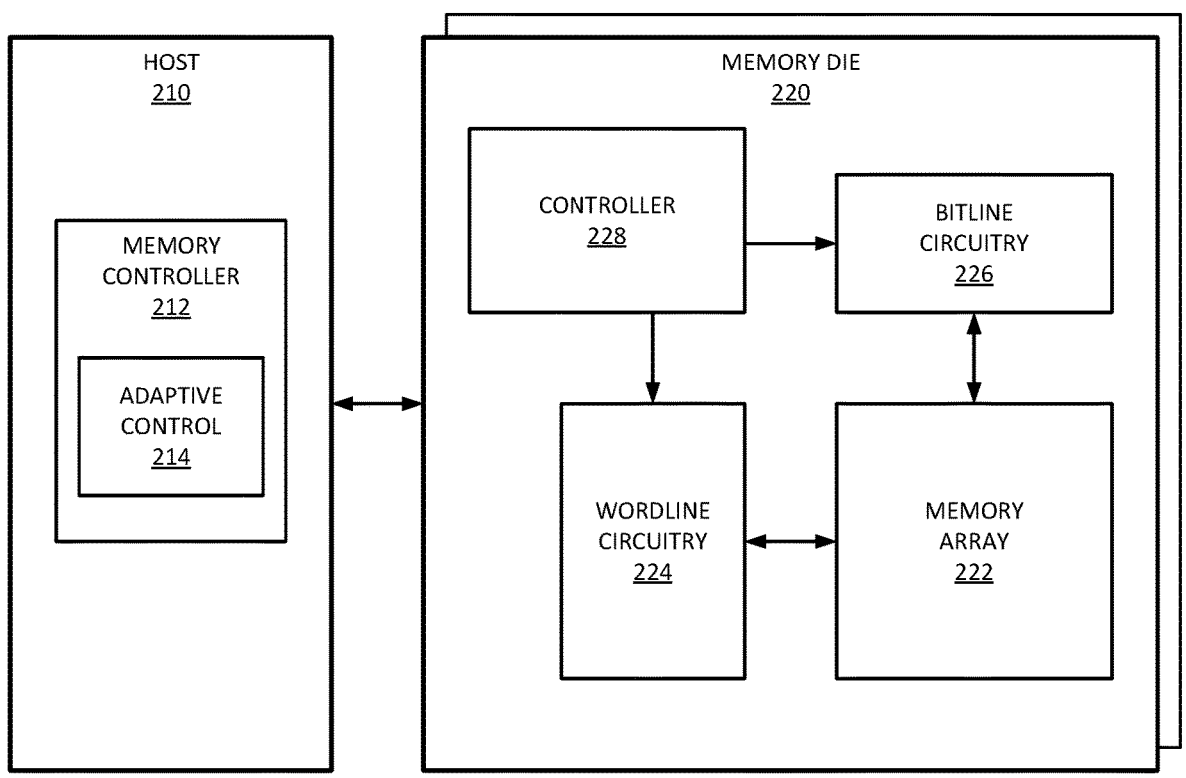
FIG. 2 is a block diagram of an example of a system with adaptive trim control logic to set trim for the nonvolatile media.

FIG. 2 is a block diagram of an example of a system with adaptive trim control logic to set trim for the nonvolatile media. System 200 provides one example of a system in accordance with system 100 of FIG. 1. System 200 includes host 210 coupled to memory die 220, which represents an example of NV media. While not specifically labeled, host 210 can be coupled to memory die 220 via one or more memory buses. System 200 does not specifically show volatile memory devices, but can include volatile memory as well as nonvolatile memory dies 220.

Host 210 includes memory controller 212, which represents a device that controls the access to memory dies 220. Access can include read or write access. In one example, memory controller 212 generates the read voltages, write currents, and other electrical settings for I/O (input/output) between host 210 and memory dies 220. The electrical settings can include preset electrical settings used to differentiate between a set state and a reset state for a memory cell.

Memory die 220 represents one or more memory dies for system 200, and can be in accordance with NV media 150 of system 100. Memory die 220 store data in resistive based memory cells. Memory die 220 includes memory array 222, which represents an array of resistive based memory cells. A memory cell provides a storage location addressable by an intersection of row and column, which can be wordline and bitline in a byte addressable memory. In one example, memory die 220 includes multiple separately addressable memory arrays 222. In one example, memory array 222 represents all memory cell resources of memory die 220. An additional memory die 220 will include one or more additional memory arrays 222.

In one example, memory die 220 includes wordline circuitry 224 or equivalent to provide access to rows or wordlines of memory array 222. Wordline circuitry 224 represents interface logic to drive data to memory array 222 for a write or to access data from memory array 222 for a read. In one example, memory die 220 includes bitline circuitry 226 or equivalent to provide access to columns or bitlines of memory array 222. Bitline circuitry 226 represents interface logic to drive data to memory array 222 for a write or to access data from memory array 222 for a read. A write may be accomplished by generating a current through a memory cell based on a differential between the bitline and wordline. A read may be accomplished by generating a read voltage across the memory cell and sensing the resistive state of the memory cell.

In one example, memory die 220 includes controller 228, which represents control logic within the memory itself, and is understood to be separate from memory controller 212 of host 210. Controller 228 can provide decoding of memory access commands to determine how to drive the control interface circuitry of bitline circuitry 226 and wordline circuitry 224. Controller 228 can control the timing of the access operations. Controller 228 can control the timing of sampling the data signal lines of a data bus (not explicitly shown), the sensing of input and output latches (not specifically shown), and control the driving of transceivers (not specifically shown). The operations will be performed based on access signals provided by host 210, which can be in accordance with preset setting values determined based on periodic sampling for calibration.

In one example, memory controller 212 is or includes an adaptive controller represented by adaptive control 214. In one example, adaptive control 214 is separate from memory controller 212. Adaptive control 214 provides an adaptive controller to perform sampling based calibration for memory die 220. Adaptive control 214 can determine settings to adjust for changes to margins for set or reset or both for memory cells of memory array 222. The settings can refer to preset values or trims that represent baseline values for performing memory access operations. In one example, adaptive control 214 provides separate control for all memory dies 220 coupled to host 210, and can thus provide die by die or chip by chip trim control.

In one example, adaptive control 214 executes an internal test mode to perform margin testing. Adaptive control 214 can periodically execute calibration tests over the life of memory die 220. The calibration can improve electrical settings for read or write or both even as cell distribution for set and reset cells changes over the life of the memory of system 200. In one example, adaptive control 214 is or includes a calibration algorithm to adapt to the changes in memory cell electrical behavior. For heavier use of the memory device, there will be more memory cell cycles, and the electrical behavior may change more quickly than a device that experience less frequent use of the NV media of memory die 220. In one example, the adaptive calibration can provide performance improvements or optimizations for memory device performance, or for memory device endurance, or both performance and endurance, or a combination.

Figure 3:
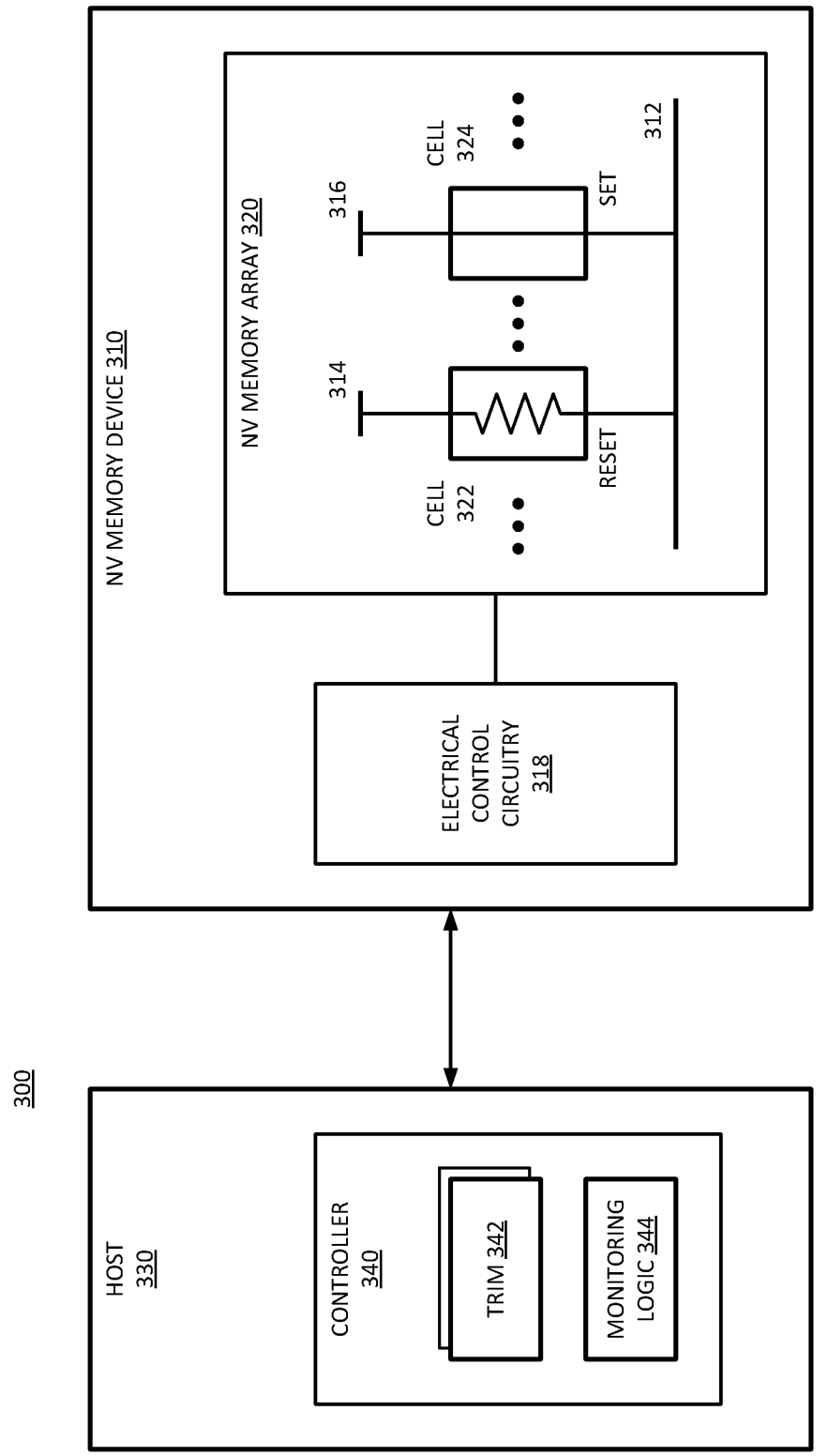
FIG. 3 is a block diagram of an example of a system with adaptive trim control to adjust preset values for a resistive-based memory.

FIG. 3 is a block diagram of an example of a system with adaptive trim control to adjust preset values for a resistive-based memory. System 300 provides one example of a system in accordance with system 100 of FIG. 1 or system 200 of FIG. 2. System 300 includes host 330 coupled to NV memory device 310.

NV memory device 310 includes NV memory array 320, which includes multiple memory cells. NV memory array 320 illustrates memory cell 322 between bitline 314 and wordline 312, as well as memory cell 324 between bitline 316 and wordline 312. In one example, cell 322 represents a reset memory cell in a resistive state, and cell 324 represents a set memory cell in a less resistive state. In one example, memory cells 322 and 324 represent cells of an array of chalcogenide glass memory cells, with a crystalline state providing a lower resistance state, and an amorphous state providing a higher resistance state.

In one example, NV memory device 310 includes electrical control circuitry 318, which can represent bitline control circuitry and wordline control circuitry. In one example, electrical control circuitry 318 applies voltages and currents as controlled by host 330 for access operations to the memory cells of NV memory array 320. In one example, the memory cells have electrical setting margins, or tolerances between a nominal value and a value that could violate the values for access operations. Violation of the values of electrical characteristics for access operations can include electrical settings that do not have proper tolerance to distinguish between set and reset states of a memory cell. The tolerances can be referred to as margins. The margins can be controlled by trim values to more precisely control the applied electrical values to provide distinction between set and reset states.

In one example, host 330 includes controller 340, which includes calibration control for NV memory array 320. In one example, controller 340 performs calibration operations to determine trims or preset values for electrical settings or other settings. In one example, the trims can include a trim value for a voltage attribute of memory access. In one example, the trims can include a trim value for a current attribute. In one example, the trims can include a trim value for a timing attribute for access to the memory array. The attributes, whether for voltages, currents, or timing, refer to configurable settings to adjust a behavior of the system in generating or applying a signal for memory access. Trim 342 represents the one or more trim values that controller can apply to the electrical settings for access operations. In one example, trim 342 includes trims for multiple different electrical settings, such as for various read voltages, or various write currents, or a combination. In one example, trim 342 includes trims per memory die or per memory device 310.

In one example, controller 340 includes monitoring logic 344 to perform periodic sampling of the trim values. In one example, controller 340 indirectly determines the trim values based on the behavior of NV memory device 310 when different trim values are applied. For example, in an internal test or calibration routine, controller 340 can apply different trim values and determine if the number of read errors improves, or can determine if a rate of read errors improves. Thus, controller 340 can apply different values to determine which values provide the best performance, such as read performance. Read performance can also indicate the performance of write electrical settings by comparing read error rate, for example, for the device by writing and then reading data, and then changing the write trims and determining if the read error rate improves. Thus, monitoring logic 344 can represent the calibration control logic executed to provide the sampling-based calibration.

Figure 4A:
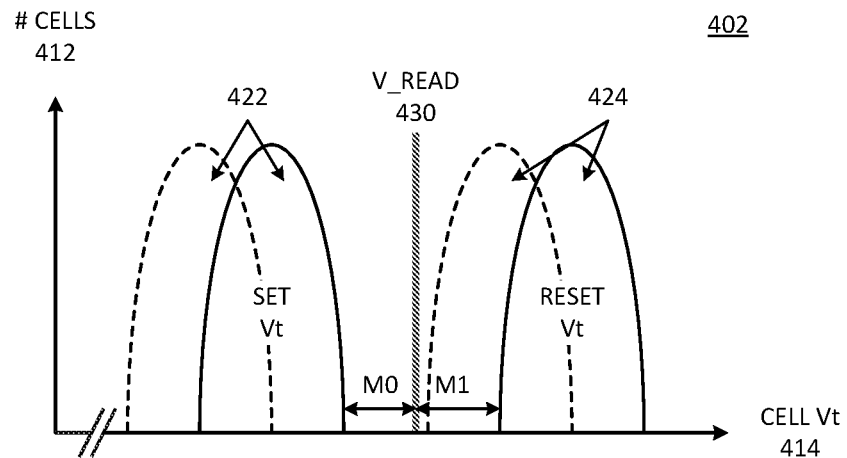
FIGS. 4A-4B are diagrammatic representations of an example of a system with adaptive control for a preset value to adjust to a shift in electrical parameter behavior over time.
Figure 4B:
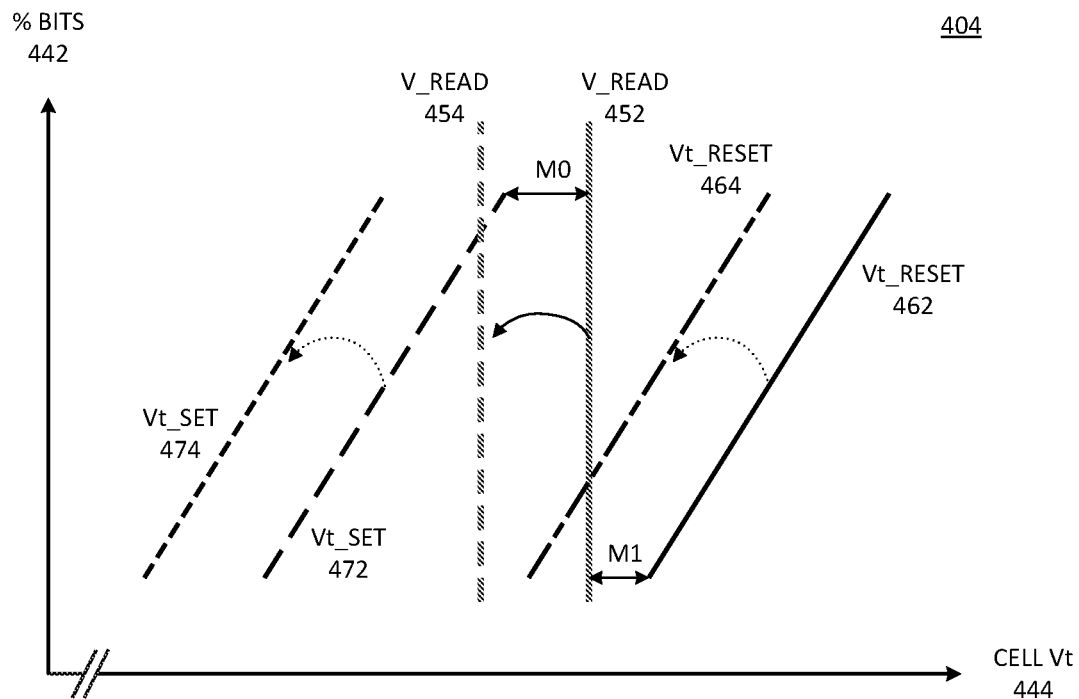

FIGS. 4A-4B are diagrammatic representations of an example of a system with adaptive control for a preset value to adjust to a shift in electrical parameter behavior over time.

Referring to FIG. 4A, diagram 402 represents Set Vt distribution 422 and Reset Vt distribution 424 mapped as cell Vt 414 against number of cells 412. Vt can refer to a voltage threshold at which a memory cell can be read to detect or sense the state of the memory cell. For a set state, Set Vt distribution 422 can be at a lower voltage level than Reset Vt distribution 424. The solid lines represent an initial characteristic of a memory device, and the dashed lines represent the electrical characteristics of the same memory device after multiple cycles of access. After multiple cycles, the distribution curve shifts down.

V_Read 430 represents a Read value to detect a Set state of a memory cell. V_Read 430 should be a high enough voltage level to trigger all the set cells, and should thus be higher than Set Vt distribution 422. As illustrated, there is a margin of M0 between V_Read 430 and Set Vt distribution 422, and a margin of M1 between V_Read 430 and Reset Vt distribution 424. However, if V_Read 430 is much higher than Set Vt distribution 422, the voltage could actually trigger cells on the bottom end of Reset Vt distribution 424, which prevent being able to distinguish a Set cell from a Reset cell. For example, consider the dashed line for Reset Vt distribution 424. As illustrated, margin M1 may be practically zero.

Referring now to FIG. 4B, diagram 404 illustrates a similar scenario as what is shown in diagram 402, but plots the percentage of bits triggered 442 by the read voltage against cell Vt 444. Diagram 404 can be similar to diagram 402, but shows a scenario where the Reset Vt distribution has drifted low enough where the read voltage will trigger both Set and Reset cells unless the read voltage is adjusted. Adjusting the read voltage can be considered adjusting the margins as the voltage can be placed somewhere between the Set and Reset distributions in a way that there is a margin on both sides of the read voltage.

More specifically, diagram 404 illustrates original Vt_Reset 462 and Vt_Set 472, which respectively represent the Reset and Set response for a memory device prior to a significant number of memory access cycles. V_Read 452 represents an initial Read voltage. V_Read 452 has a margin of M0 with respect to Vt_Set 472, and a margin of M1 with respect to Vt_Reset 462. In one example, margins M0 and M1 are the same or substantially the same, indicating that V_Read 452 is set to be directly between the high end of the Set distribution curve and the bottom end of the Reset distribution. In one example, as illustrated, M0 and M1 are not necessarily the same.

As illustrated by the dotted arrows, over time or over the life of the memory device, Vt_Set 472 can shift down to Vt_Set 474, and Vt_Reset 462 can shift down to Vt_Reset 464. It will be observed that Vt_Reset 464 intersects with V_Read 452. In one example, a controller performs adaptive calibration of the memory device represented by diagram 404. Based on adaptive calibration, the controller periodically samples, or samples on occasion to determine if the voltage margins have changed. In response to detecting a change in the margins, the controller can adjust a trim to cause a shift of the Read voltage to V_Read 454, which is between Vt_Reset 464 and Vt_Set 474. Thus, the Read voltage should trigger all Set cells without triggering Reset cells, allowing distinction between the two states.

In one example, the detection of change in the margins can be accomplished by detection of a read retry rate being higher than a threshold. For example, if a read retry rate is higher than a threshold, the system can trigger a sampling of the margins, and adjust the trims if a new value is determined to provide better device operation. Similarly, in one example, the detection of change in the margins can be accomplished by detection of a number of bit errors being greater than a threshold. Similarly, detection of the greater bit errors can cause the system to adjust a trim for an electrical setting.

Diagrams 402 and 404 represent Read voltages, and the corresponding calibration can adjust a voltage trim to adjust the Read voltage. In one example, the Read voltage represents one of one or more demarcation voltages. It will be understood that similar curves could be illustrated for a Write current, which would show a similar adjustment to the Write current based on a shift in distribution of memory die behavior to the Write current.

Figure 5:
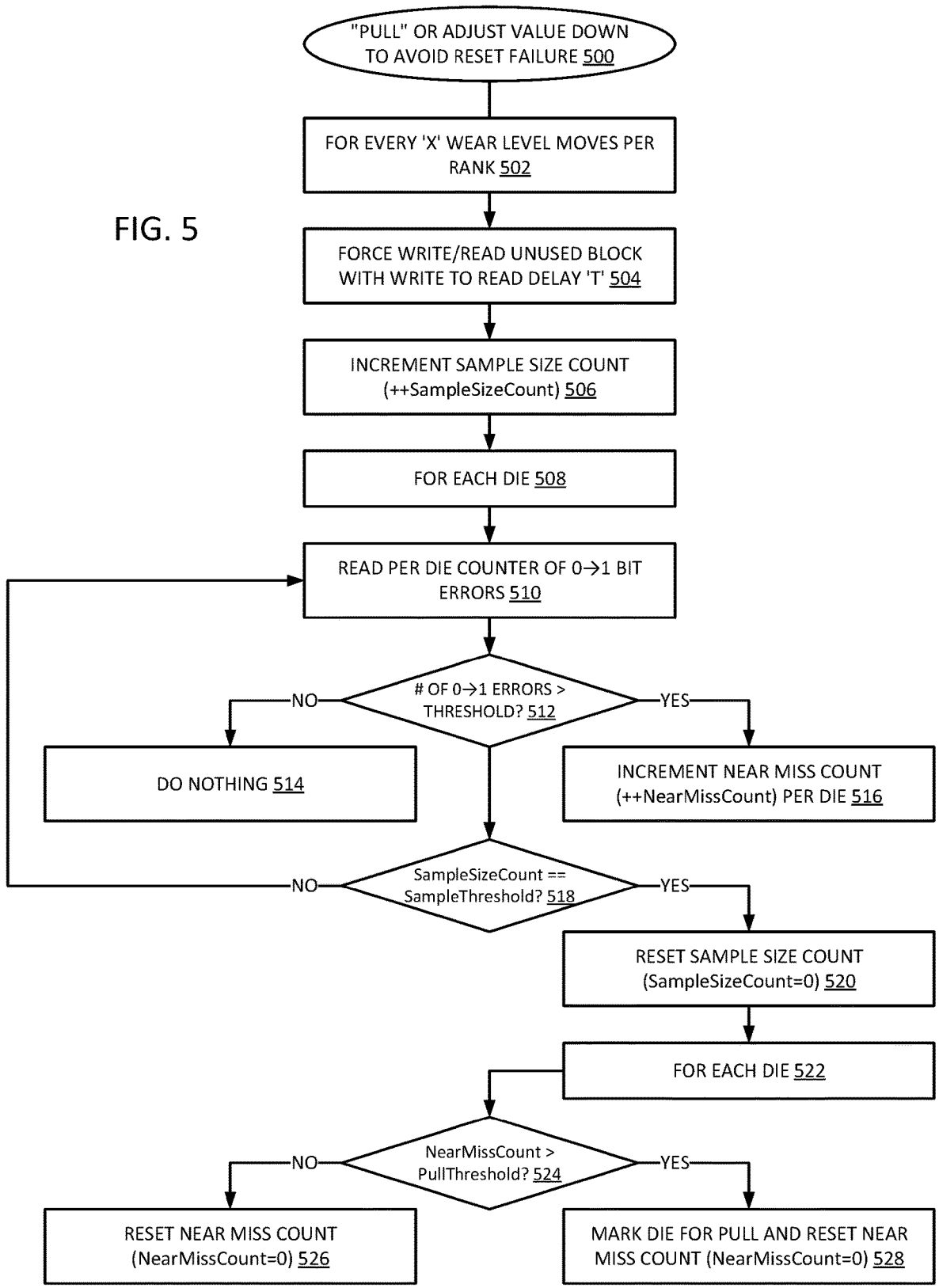
FIG. 5 is a flow diagram of an example of a process for adjusting a value down to avoid reset failure.

FIG. 5 is a flow diagram of an example of a process for adjusting a value down to avoid reset failure. Process 500 represents an example of a process to pull or adjust a value of a preset electrical setting down for read voltage to avoid a reset failure. One of skill in the art will understand a similar process for a write current. The pulling of the read voltage down can address the endurance of the memory device, by increasing the life of the device.

In one example, for every 'X' wear level moves per rank, the process performs calibration sampling and monitoring, at 502. In one example, the system can trigger calibration in response to an error reaching or exceeding a threshold. In one example, the system can trigger calibration in response to a number of accesses or wear levels being reached or exceeded. In one example, the system can trigger calibration in response to a combination of these.

In one example, the controller forces a write and a read to an unused block with a write to read delay of 'T', at 504, where T refers to a write to read delay for the device. The delay ensures that the written data is available to be read. In one example, the system increments the sample size count (such as a ++SampleSizeCount operation), at 506. The sample size count can refer to the number of samples taken to determine the proper trim. In one example, the system performs calibration separately per die, at 508.

In one example, the controller reads a per die counter of zero to one bit errors detected during sampling, at 510, referring to the number of Reset cells detected as Set cells. If the number of zero to one bit errors is not greater than a threshold, 512 NO branch, the controller does nothing, or does not adjust the voltage trim, at 514. If the number of zero to one bits errors is greater than a threshold, 512 YES branch, in one example, the controller can increment a near miss count (such as a ++NearMissCount operation), at 516. The operation can be performed per die. The near miss count can indicate a number of errors caused by a collapse of the margins.

After determining the number of zero to one bit errors at 512, the controller can determine if the sampling is complete. Thus, the controller can determine if the SampleSizeCount is equal to a SampleThreshold, at 518, referring to a number of samples to be taken for the calibration operation. If the SampleSizeCount is not equal to the SampleThreshold, 518 NO branch, in one example, the controller continues to sample and read zero to one bit errors at 510. If the SampleSizeCount is equal to a SampleThreshold, 518 YES branch, the controller resets the sample size count (for example, with a SampleSizeCount=0 operation), at 520. Resetting the sample size count prepares the count for a subsequent calibration operation. Alternatively, the resetting of the count could be performed at the initialization of the calibration process.

In on example, the controller performs the operations per die, at 522, and determines if the number of errors indicates that the Read voltage should be pulled down. In one example, if the NearMissCount is not greater than a PullThreshold, or a threshold number of errors for the samples made for the nonvolatile media, 524 NO branch, the controller can reset the near miss count, at 526. If the sampling is completed and the near miss count does not trigger an adjustment to the electrical setting, the controller can reset the count to prepare for a subsequent calibration without performing other operations. In one example, if the NearMissCount is greater than the PullThreshold, 524 YES branch, the controller can mark the die for a pull operation and reset the near miss count, at 528. In such a case, the controller can reset the near miss count for a subsequent calibration operation and also mark the die for adjustment to the read voltage.

Figure 6:
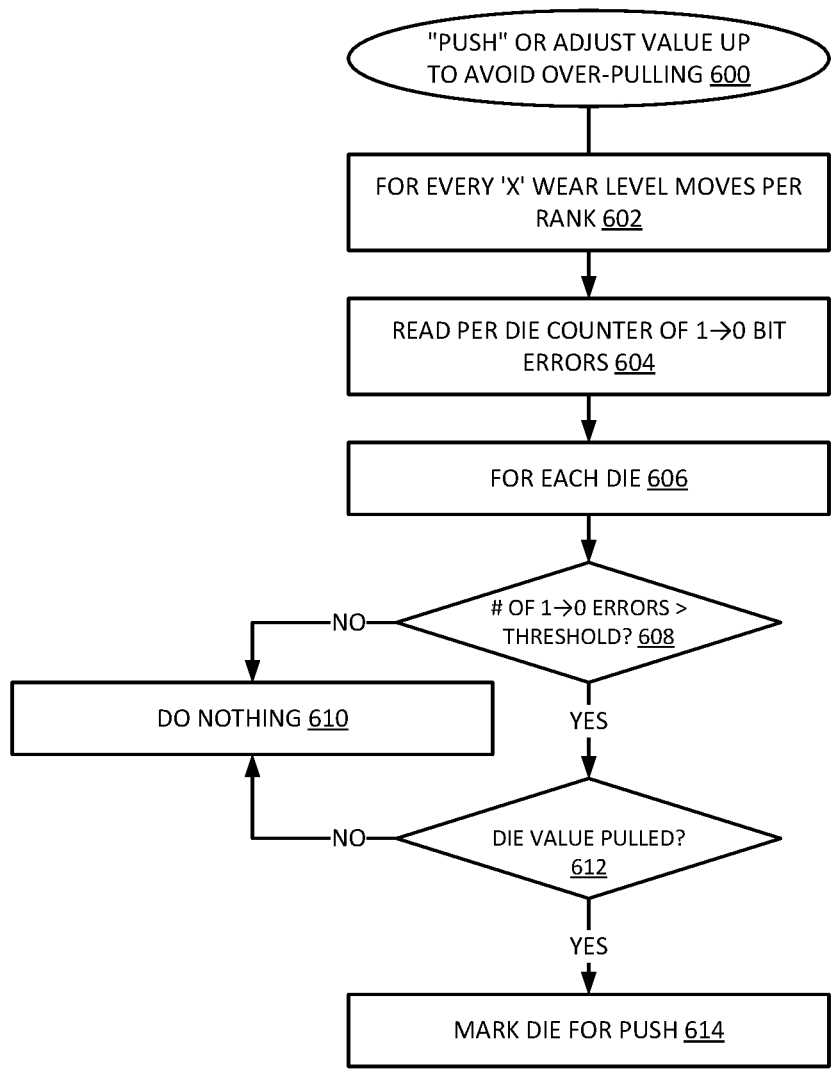
FIG. 6 is a flow diagram of an example of a process for adjusting a value up to avoid over-adjusting the value down.

FIG. 6 is a flow diagram of an example of a process for adjusting a value up to avoid over-adjusting the value down. Process 600 represents an example of a process to push or adjust a value of a preset electrical setting up for read voltage to avoid over-pulling. Process 600 will be understood to take place in response to execution of process 500. One of skill in the art will understand a similar process for a write current. The pushing of the read voltage up can address the performance of the memory device, by increasing the read voltage to a value that still does not cause more than a threshold number of errors. It will be understood that a higher read voltage can more quickly trigger the reads, while too high a read voltage will not properly distinguish a Set and a Reset cell, as mentioned above.

In one example, for every 'X' wear level moves per rank, the process performs the calibration adjustment, at 602. In one example, the system can trigger the calibration adjustment in response to execution of calibration. In one example, the controller executes process 600 each time it executes process 500.

In one example, the controller reads a per die counter of zero to one bit errors detected during sampling, at 604, referring to the number of Reset cells detected as Set cells. In one example, the controller performs process 600 for each die of multiple dies in a system, at 606. If the number of one to zero bit errors is not greater than a threshold, 608 NO branch, the controller does nothing, or does not adjust the voltage trim, at 610. If the number of one to zero bit errors is greater than a threshold, 608 YES branch, in one example, the controller can determine if the electrical setting has been pulled, at 612. If the value has not been pulled, 612 NO branch, then the electrical setting value has not been adjusted down to need to be adjusted up, and the controller does not adjust the setting, at 610. If the value has been pulled, 612 YES branch, in one example, the controller can mark the die for a push operation, at 614.

Figure 7:
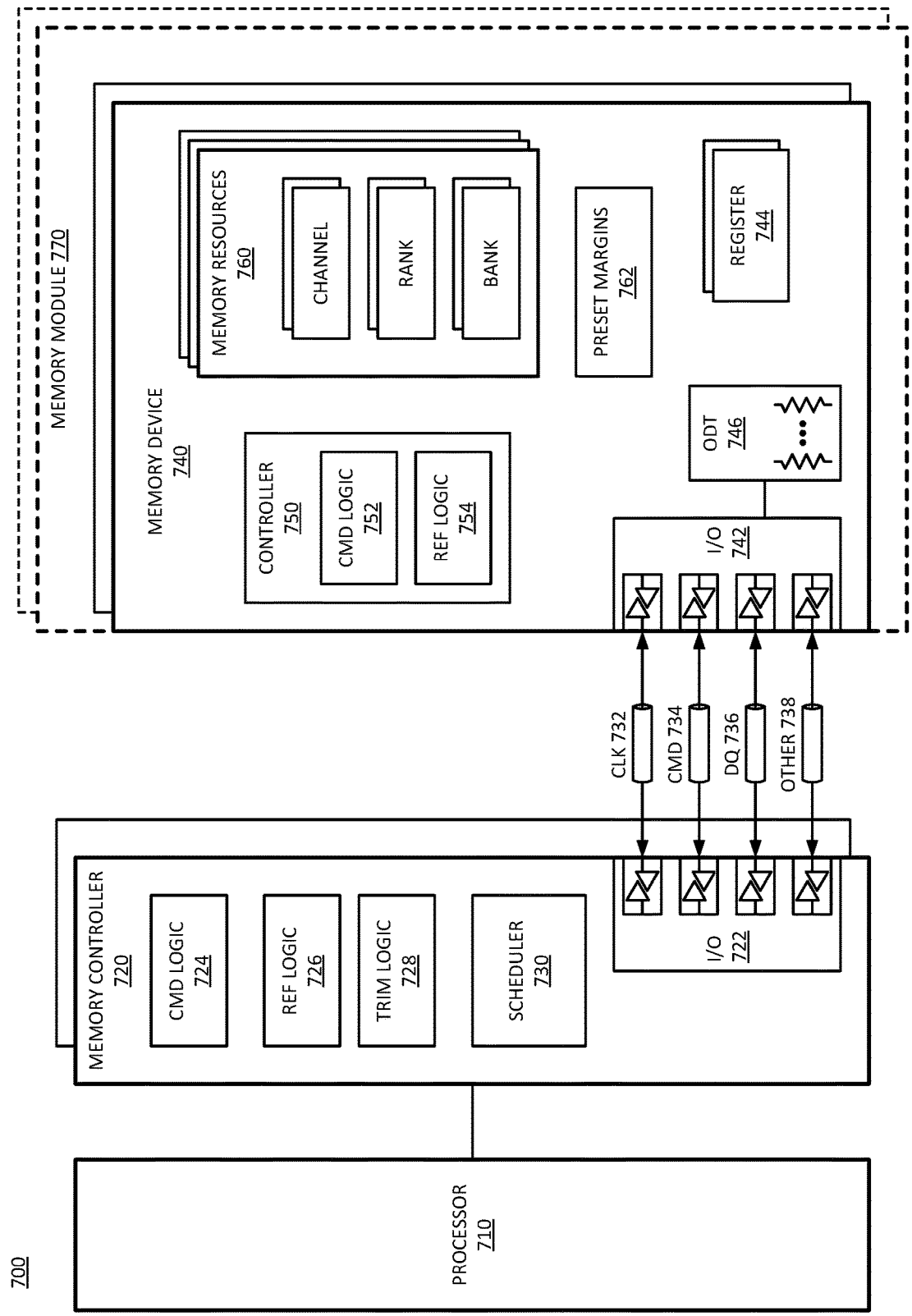
FIG. 7 is a block diagram of an example of a memory subsystem in which adaptive margin control can be implemented.

FIG. 7 is a block diagram of an example of a memory subsystem in which adaptive margin control can be implemented. System 700 includes a processor and elements of a memory subsystem in a computing device.

In one example, system 700 includes trim logic 728 in memory controller 720. Trim logic 728 can represent adaptive control for sampling based calibration in accordance with any example herein. In one example, trim logic 728 determines and records trim values for one or more electrical settings for a nonvolatile memory device. In one example, at least one memory device 740 include a nonvolatile media with resistive based memory cells. It will be understood that a resistive based nonvolatile memory does not need refresh logic. In one example, such a nonvolatile memory device 740 includes preset margins 762. The preset margins represent margins set for the cell distribution of the memory device over time, as the electrical characteristics of the device change as the memory cells are cycled over time. In one example, trim logic 728 adjusts one or more electrical settings based on changes to the margins to keep at least a desired preset margin.

Processor 710 represents a processing unit of a computing platform that may execute an operating system (OS) and applications, which can collectively be referred to as the host or the user of the memory. The OS and applications execute operations that result in memory accesses. Processor 710 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 700 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 720 represents one or more memory controller circuits or devices for system 700. Memory controller 720 represents control logic that generates memory access commands in response to the execution of operations by processor 710. Memory controller 720 accesses one or more memory devices 740. Memory devices 740 can be DRAM devices in accordance with any referred to above. In one example, memory devices 740 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 720 manages a separate memory channel, although system 700 can be configured to have multiple channels managed by a single controller, or to have multiple controllers on a single channel. In one example, memory controller 720 is part of host processor 710, such as logic implemented on the same die or implemented in the same package space as the processor.

Memory controller 720 includes I/O interface logic 722 to couple to a memory bus, such as a memory channel as referred to above. I/O interface logic 722 (as well as I/O interface logic 742 of memory device 740) can include pins, pads, connectors, signal lines, traces, or wires, or other hardware to connect the devices, or a combination of these. I/O interface logic 722 can include a hardware interface. As illustrated, I/O interface logic 722 includes at least drivers/transceivers for signal lines. Commonly, wires within an integrated circuit interface couple with a pad, pin, or connector to interface signal lines or traces or other wires between devices. I/O interface logic 722 can include drivers, receivers, transceivers, or termination, or other circuitry or combinations of circuitry to exchange signals on the signal lines between the devices. The exchange of signals includes at least one of transmit or receive. While shown as coupling I/O 722 from memory controller 720 to I/O 742 of memory device 740, it will be understood that in an implementation of system 700 where groups of memory devices 740 are accessed in parallel, multiple memory devices can include I/O interfaces to the same interface of memory controller 720. In an implementation of system 700 including one or more memory modules 770, I/O 742 can include interface hardware of the memory module in addition to interface hardware on the memory device itself. Other memory controllers 720 will include separate interfaces to other memory devices 740.

The bus between memory controller 720 and memory devices 740 can be implemented as multiple signal lines coupling memory controller 720 to memory devices 740. The bus may typically include at least clock (CLK) 732, command/address (CMD) 734, and write data (DQ) and read data (DQ) 736, and zero or more other signal lines 738. In one example, a bus or connection between memory controller 720 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 700 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 720 and memory devices 740. An example of a serial bus technology is 8B10B encoding and transmission of high-speed data with embedded clock over a single differential pair of signals in each direction. In one example, CMD 734 represents signal lines shared in parallel with multiple memory devices. In one example, multiple memory devices share encoding command signal lines of CMD 734, and each has a separate chip select (CS_n) signal line to select individual memory devices.

It will be understood that in the example of system 700, the bus between memory controller 720 and memory devices 740 includes a subsidiary command bus CMD 734 and a subsidiary bus to carry the write and read data, DQ 736. In one example, the data bus can include bidirectional lines for read data and for write/command data. In another example, the subsidiary bus DQ 736 can include unidirectional write signal lines for write and data from the host to memory, and can include unidirectional lines for read data from the memory to the host. In accordance with the chosen memory technology and system design, other signals 738 may accompany a bus or sub bus, such as strobe lines DQS. Based on design of system 700, or implementation if a design supports multiple implementations, the data bus can have more or less bandwidth per memory device 740. For example, the data bus can support memory devices that have either a x32 interface, a x16 interface, a x8 interface, or other interface. The convention "xW," where W is an integer that refers to an interface size or width of the interface of memory device 740, which represents a number of signal lines to exchange data with memory controller 720. The interface size of the memory devices is a controlling factor on how many memory devices can be used concurrently per channel in system 700 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 740 and memory controller 720 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 740 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 740 represent memory resources for system 700. In one example, each memory device 740 is a separate memory die. In one example, each memory device 740 can interface with multiple (e.g., 2) channels per device or die. Each memory device 740 includes I/O interface logic 742, which has a bandwidth determined by the implementation of the device (e.g., x16 or x8 or some other interface bandwidth). I/O interface logic 742 enables the memory devices to interface with memory controller 720. I/O interface logic 742 can include a hardware interface, and can be in accordance with I/O 722 of memory controller, but at the memory device end. In one example, multiple memory devices 740 are connected in parallel to the same command and data buses. In another example, multiple memory devices 740 are connected in parallel to the same command bus, and are connected to different data buses. For example, system 700 can be configured with multiple memory devices 740 coupled in parallel, with each memory device responding to a command, and accessing memory resources 760 internal to each. For a Write operation, an individual memory device 740 can write a portion of the overall data word, and for a Read operation, an individual memory device 740 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 740 are disposed directly on a motherboard or host system platform (e.g., a PCB (printed circuit board) on which processor 710 is disposed) of a computing device. In one example, memory devices 740 can be organized into memory modules 770. In one example, memory modules 770 represent dual inline memory modules (DIMMs). In one example, memory modules 770 represent other organization of multiple memory devices to share at least a portion of access or control circuitry, which can be a separate circuit, a separate device, or a separate board from the host system platform. Memory modules 770 can include multiple memory devices 740, and the memory modules can include support for multiple separate channels to the included memory devices disposed on them. In another example, memory devices 740 may be incorporated into the same package as memory controller 720, such as by techniques such as multi-chip-module (MCM), package-on-package, through-silicon via (TSV), or other techniques or combinations. Similarly, in one example, multiple memory devices 740 may be incorporated into memory modules 770, which themselves may be incorporated into the same package as memory controller 720. It will be appreciated that for these and other implementations, memory controller 720 may be part of host processor 710.

Memory devices 740 each include memory resources 760. Memory resources 760 represent individual arrays of memory locations or storage locations for data. Typically memory resources 760 are managed as rows of data, accessed via wordline (rows) and bitline (individual bits within a row) control. Memory resources 760 can be organized as separate channels, ranks, and banks of memory. Channels may refer to independent control paths to storage locations within memory devices 740. Ranks may refer to common locations across multiple memory devices (e.g., same row addresses within different devices). Banks may refer to arrays of memory locations within a memory device 740. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 740 include one or more registers 744. Register 744 represents one or more storage devices or storage locations that provide configuration or settings for the operation of the memory device. In one example, register 744 can provide a storage location for memory device 740 to store data for access by memory controller 720 as part of a control or management operation. In one example, register 744 includes one or more Mode Registers. In one example, register 744 includes one or more multipurpose registers. The configuration of locations within register 744 can configure memory device 740 to operate in different "modes," where command information can trigger different operations within memory device 740 based on the mode. Additionally or in the alternative, different modes can also trigger different operation from address information or other signal lines depending on the mode. Settings of register 744 can indicate configuration for I/O settings (e.g., timing, termination or ODT (on-die termination) 746, driver configuration, or other I/O settings).

In one example, memory device 740 includes ODT 746 as part of the interface hardware associated with I/O 742. ODT 746 can be configured as mentioned above, and provide settings for impedance to be applied to the interface to specified signal lines. In one example, ODT 746 is applied to DQ signal lines. In one example, ODT 746 is applied to command signal lines. In one example, ODT 746 is applied to address signal lines. In one example, ODT 746 can be applied to any combination of the preceding. The ODT settings can be changed based on whether a memory device is a selected target of an access operation or a non-target device. ODT 746 settings can affect the timing and reflections of signaling on the terminated lines. Careful control over ODT 746 can enable higher-speed operation with improved matching of applied impedance and loading. ODT 746 can be applied to specific signal lines of I/O interface 742, 722, and is not necessarily applied to all signal lines.

Memory device 740 includes controller 750, which represents control logic within the memory device to control internal operations within the memory device. For example, controller 750 decodes commands sent by memory controller 720 and generates internal operations to execute or satisfy the commands. Controller 750 can be referred to as an internal controller, and is separate from memory controller 720 of the host. Controller 750 can determine what mode is selected based on register 744, and configure the internal execution of operations for access to memory resources 760 or other operations based on the selected mode. Controller 750 generates control signals to control the routing of bits within memory device 740 to provide a proper interface for the selected mode and direct a command to the proper memory locations or addresses. Controller 750 includes command logic 752, which can decode command encoding received on command and address signal lines. Thus, command logic 752 can be or include a command decoder. With command logic 752, memory device can identify commands and generate internal operations to execute requested commands.

Referring again to memory controller 720, memory controller 720 includes command (CMD) logic 724, which represents logic or circuitry to generate commands to send to memory devices 740. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 740, memory controller 720 can issue commands via I/O 722 to cause memory device 740 to execute the commands. In one example, controller 750 of memory device 740 receives and decodes command and address information received via I/O 742 from memory controller 720. Based on the received command and address information, controller 750 can control the timing of operations of the logic and circuitry within memory device 740 to execute the commands. Controller 750 is responsible for compliance with standards or specifications within memory device 740, such as timing and signaling requirements. Memory controller 720 can implement compliance with standards or specifications by access scheduling and control.

Memory controller 720 includes scheduler 730, which represents logic or circuitry to generate and order transactions to send to memory device 740. From one perspective, the primary function of memory controller 720 could be said to schedule memory access and other transactions to memory device 740. Such scheduling can include generating the transactions themselves to implement the requests for data by processor 710 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 720 typically includes logic such as scheduler 730 to allow selection and ordering of transactions to improve performance of system 700. Thus, memory controller 720 can select which of the outstanding transactions should be sent to memory device 740 in which order, which is typically achieved with logic much more complex that a simple first-in first-out algorithm. Memory controller 720 manages the transmission of the transactions to memory device 740, and manages the timing associated with the transaction. In one example, transactions have deterministic timing, which can be managed by memory controller 720 and used in determining how to schedule the transactions with scheduler 730.

In one example, memory controller 720 includes refresh (REF) logic 726. Refresh logic 726 can be used for memory resources that are volatile and need to be refreshed to retain a deterministic state. In one example, refresh logic 726 indicates a location for refresh, and a type of refresh to perform. Refresh logic 726 can trigger self-refresh within memory device 740, or execute external refreshes which can be referred to as auto refresh commands) by sending refresh commands, or a combination. In one example, system 700 supports all bank refreshes as well as per bank refreshes. All bank refreshes cause the refreshing of banks within all memory devices 740 coupled in parallel. Per bank refreshes cause the refreshing of a specified bank within a specified memory device 740. In one example, controller 750 within memory device 740 includes refresh logic 754 to apply refresh within memory device 740. In one example, refresh logic 754 generates internal operations to perform refresh in accordance with an external refresh received from memory controller 720. Refresh logic 754 can determine if a refresh is directed to memory device 740, and what memory resources 760 to refresh in response to the command.

Figure 8:
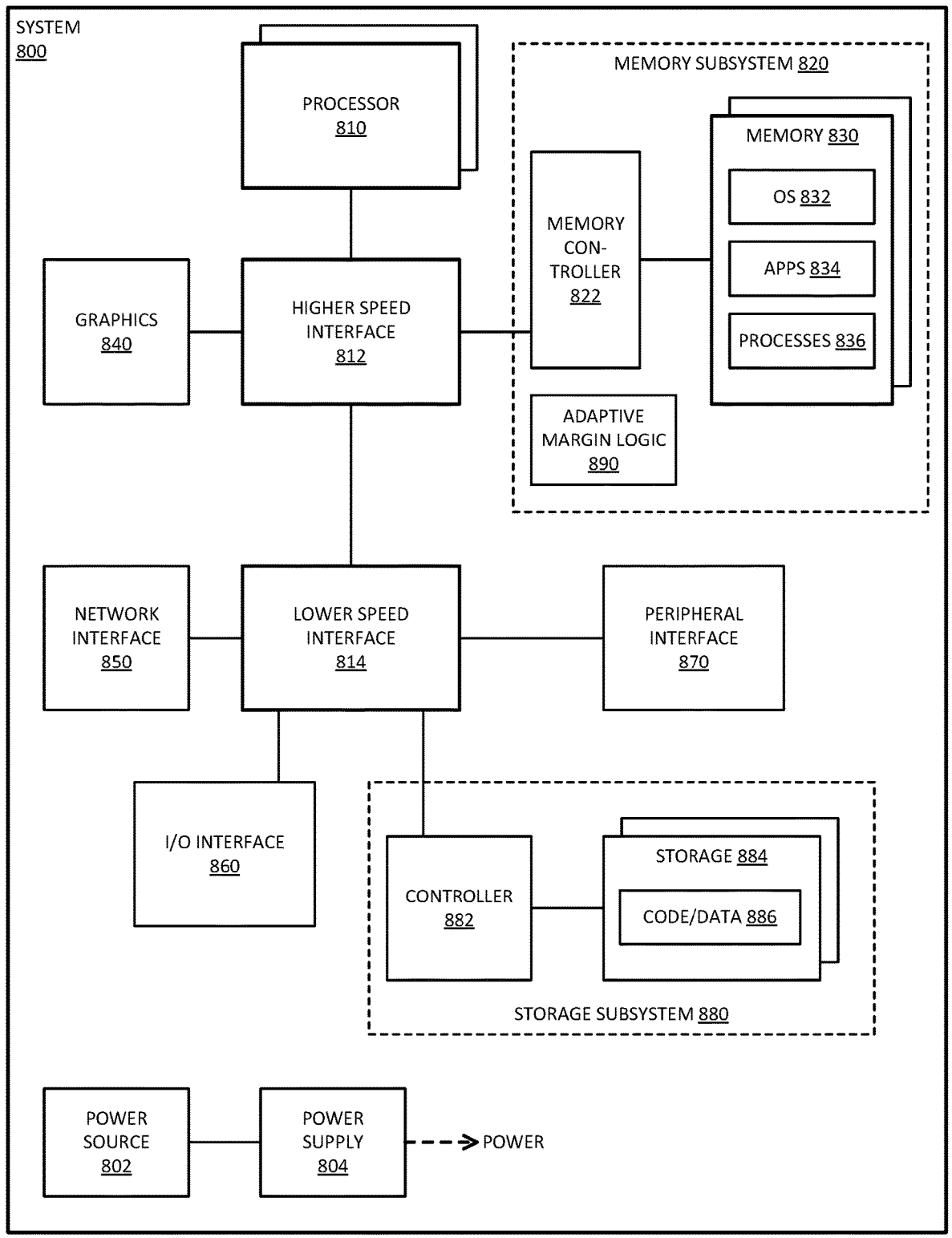
FIG. 8 is a block diagram of an example of a computing system in which a memory with adaptive margin control can be implemented.

FIG. 8 is a block diagram of an example of a computing system in which a memory with adaptive margin control can be implemented. System 800 represents a computing device in accordance with any example herein, and can be a laptop computer, a desktop computer, a tablet computer, a server, a gaming or entertainment control system, embedded computing device, or other electronic device.

In one example, system 800 includes adaptive margin logic 890 in memory subsystem 820. Adaptive margin logic 890 can represent adaptive control for sampling based calibration in accordance with any example herein. In one example, adaptive margin logic 890 determines and records trim values for one or more electrical settings for a nonvolatile memory device. As the electrical characteristics of the nonvolatile memory device changes as the memory cells are cycled over time, adaptive margin logic 890 adjusts one or more electrical settings to respond to the changes in the operating margins of the memory cells.

System 800 includes processor 810 can include any type of microprocessor, central processing unit (CPU), graphics processing unit (GPU), processing core, or other processing hardware, or a combination, to provide processing or execution of instructions for system 800. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 802 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

Figure 9:
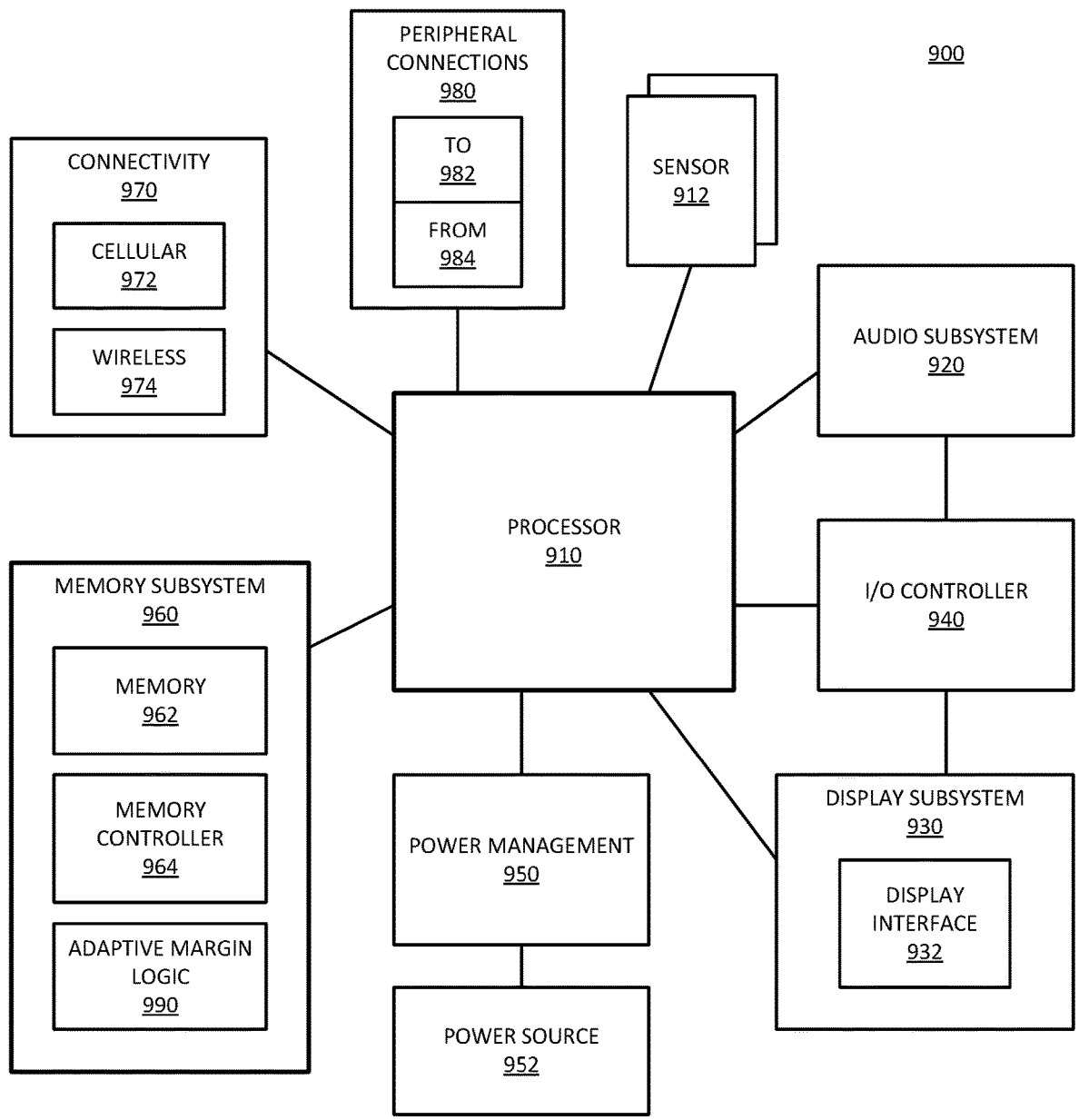
FIG. 9 is a block diagram of an example of a mobile device in which a memory with adaptive margin control can be implemented.

FIG. 9 is a block diagram of an example of a mobile device in which a memory with adaptive margin control can be implemented. Device 900 represents a mobile computing device, such as a computing tablet, a mobile phone or smartphone, wearable computing device, or other mobile device, or an embedded computing device. It will be understood that certain of the components are shown generally, and not all components of such a device are shown in device 900.

In one example, system 900 includes adaptive margin logic 990 in memory subsystem 960. Adaptive margin logic 990 can represent adaptive control for sampling based calibration in accordance with any example herein. In one example, adaptive margin logic 990 determines and records trim values for one or more electrical settings for a nonvolatile memory device. As the electrical characteristics of the nonvolatile memory device changes as the memory cells are cycled over time, adaptive margin logic 990 adjusts one or more electrical settings to respond to the changes in the operating margins of the memory cells.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting device 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one example, one or more sensors 912 couples to processor 910 via a frontend circuit integrated with processor 910. In one example, one or more sensors 912 couples to processor 910 via another component of system 900.

In one example, device 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 900, or connected to device 900. In one example, a user interacts with device 900 by providing audio commands that are received and processed by processor 910.

Display subsystem 930 represents hardware (e.g., display devices) and software components (e.g., drivers) that provide a visual display for presentation to a user. In one example, the display includes tactile components or touchscreen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in device 900, or sensors 912. The input can be part of direct user interaction, as well as providing environmental input to the system to influence its operations (such as filtering for noise, adjusting displays for brightness detection, applying a flash for a camera, or other features).

In one example, device 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in device 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable device 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, a memory device includes: a memory array having multiple nonvolatile memory cells that store data as either a set or a reset state of the memory cells; and a controller coupled to the memory array, the controller to periodically sample set and reset margins for memory cells of the memory array, and in response to detection of a change in a margin, to adaptively adjust a preset setting such as an electrical setting used to differentiate between a set state and a reset state for a memory cell.

In one example, the nonvolatile memory cells comprise memory cells that store data based on a resistive state. In one example, the nonvolatile memory cells comprise cells of a three-dimensional crosspoint memory array. In one example, the preset electrical setting comprises a trim value for a voltage attribute, or a current attribute, or a timing attribute. In one example, the preset electrical setting comprises a voltage trim for a read voltage. In one example, the voltage trim for the read voltage comprises a voltage trim for a demarcation voltage (Vdm). In one example, the preset electrical setting comprises a trim value for a write current. In one example, detection of the change in the margin comprises detection of a read retry rate higher than a threshold. In one example, detection of the change in the margin comprises detection of a number of bit errors greater than a threshold. In one example, the memory array comprises a first memory array of a first die, and further comprising a second memory array of a second memory die, wherein the controller is to adaptively adjust preset electrical settings independent for the first and second dies.

In general with respect to the descriptions herein, in one example, a system includes: a system memory bus; a volatile memory device coupled to the system memory bus to provide byte-addressable random access to volatile memory media; and a nonvolatile memory device coupled to the system memory bus to provide byte-addressable random access to nonvolatile memory media, the nonvolatile memory device including: a memory array having multiple memory cells that store data as either a set or a reset state of the memory cells; and a controller coupled to the memory array, the controller to periodically sample set and reset margins for memory cells of the memory array, and in response to detection of a change in a margin, to adaptively adjust a preset setting such as an electrical setting used to differentiate between a set state and a reset state for a memory cell.

In one example, the system further includes: a host processor device coupled to the system memory bus; a memory controller coupled to the volatile memory and the nonvolatile memory over the system memory bus; a display communicatively coupled to a host processor; a network interface communicatively coupled to a host processor; or a battery to power the system.

In general with respect to the descriptions herein, in one example, a method for adjusting margin in a memory includes: periodically sampling set and reset margins for nonvolatile memory cells of a memory array having multiple memory cells that store data as either a set or a reset state of the memory cells; and adaptively adjusting a preset setting such as an electrical setting used to differentiate between a set state and a reset state for a memory cell in response to detecting a change in a margin. In one example, the nonvolatile memory cells comprise memory cells that store data based on a resistive state. In one example, the nonvolatile memory cells comprise cells of a three-dimensional crosspoint memory array. In one example, the preset electrical setting comprises a trim value for a voltage attribute, or a current attribute, or a timing attribute. In one example, the preset electrical setting comprises a voltage trim for a read voltage. In one example, the voltage trim for the read voltage comprises a voltage trim for a demarcation voltage (Vdm). In one example, the preset electrical setting comprises a trim value for a write current. In one example, detection of the change in the margin comprises detection of a read retry rate higher than a threshold. In one example, detection of the change in the margin comprises detection of a number of bit errors greater than a threshold. In one example, adaptively adjusting the preset setting includes adjusting preset settings independently for multiple different dies.

In general with respect to the descriptions herein, in one example, a memory controller including: a hardware interface to couple to a memory device having multiple nonvolatile memory cells that store data as either a set or a reset state of the memory cells; control logic to periodically cause the memory device to sample set and reset margins for memory cells of the memory device, and in response to detection of a change in a margin, to adaptively adjust a preset access setting used to differentiate between a set state and a reset state for a memory cell; and a register to store one or more preset access settings for the hardware interface to apply in a subsequent access to the memory controller.

In one example, the preset setting comprises a trim value of an electrical setting for a voltage attribute, or a current attribute, or a timing attribute. In one example, the control logic is to cause the memory device to sample set and reset margins in response to detection of a read retry rate higher than a threshold, or in response to detection of a number of bit errors greater than a threshold. In one example, the memory device comprises a first of multiple memory devices, wherein the control logic is to periodically cause the first memory device to sample set and reset margins for memory cells of the first memory device, and to periodically cause a second of the multiple memory devices to sample set and reset margins for memory cells of the second memory device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
   a memory array having multiple nonvolatile memory cells that store data as either a set or a reset state of the memory cells; and
   a controller coupled to the memory array, the controller to periodically sample set and reset margins for memory cells of the memory array, and in response to detection of a change in a margin, to adaptively adjust a preset access setting used to differentiate between a set state and a reset state for a memory cell;
   wherein detection of the change in the margin includes either detection of a read retry rate higher than a retry rate threshold or detection of a number of bit errors greater than a bit error threshold.

2. The memory device of claim 1, wherein the nonvolatile memory cells comprise memory cells that store data based on a resistive state.

3. The memory device of claim 2, wherein the nonvolatile memory cells comprise cells of a three-dimensional crosspoint memory array.

4. The memory device of claim 1, wherein the preset access setting comprises a trim value of an electrical setting for a voltage attribute, or a current attribute, or a timing attribute.

5. The memory device of claim 4, wherein the electrical setting comprises a voltage trim for a read voltage.

6. The memory device of claim 5, wherein the voltage trim for the read voltage comprises a voltage trim for a demarcation voltage (Vdm).

7. The memory device of claim 4, wherein the electrical setting comprises a trim value for a write current.

8. The memory device of claim 1, wherein the memory array comprises a first memory array of a first memory die, and further comprising a second memory array of a second memory die, wherein the controller is to adaptively adjust preset electrical settings independent for the first memory die and the second memory die.

9. A system comprising:
   a system memory bus;
   a volatile memory device coupled to the system memory bus to provide byte-addressable random access to volatile memory media; and
   a nonvolatile memory device coupled to the system memory bus to provide byte-addressable random access to nonvolatile memory media, the nonvolatile memory device including:
   a memory array having multiple nonvolatile memory cells that store data as either a set or a reset state of the nonvolatile memory cells; and
   a controller coupled to the memory array, the controller to periodically sample set and reset margins for nonvolatile memory cells of the memory array, and in response to detection of a change in a margin, to adaptively adjust a preset access setting used to differentiate between a set state and a reset state for a nonvolatile memory cell;

wherein detection of the change in the margin includes either detection of a read retry rate higher than a retry rate threshold or detection of a number of bit errors greater than a bit error threshold.

10. The system of claim 9, wherein the nonvolatile memory cells comprise memory cells that store data based on a resistive state.

11. The system of claim 10, wherein the multiple nonvolatile memory cells comprise cells of a three-dimensional crosspoint memory array.

12. The system of claim 9, wherein the preset access setting comprises a trim value of an electrical setting for a voltage attribute, or a current attribute, or a timing attribute.

13. The system of claim 12, wherein the electrical setting comprises a voltage trim for a read voltage.

14. The system of claim 13, wherein the voltage trim for the read voltage comprises a voltage trim for a demarcation voltage (Vdm).

15. The system of claim 12, wherein the electrical setting comprises a trim value for a write current.

16. The system of claim 9, wherein the memory array comprises a first memory array of a first memory die, and further comprising a second memory array of a second memory die, wherein the controller is to adaptively adjust preset electrical settings independent for the first memory die and the second memory die.

17. The system of claim 9, further comprising:
a host processor device coupled to the system memory bus;
a memory controller coupled to the volatile memory device and the nonvolatile memory device over the system memory bus;
a display communicatively coupled to a host processor;
a network interface communicatively coupled to a host processor; or
a battery to power the system.

18. A method for adjusting margin in a memory, comprising:
periodically sampling set and reset margins for nonvolatile memory cells of a memory array having multiple memory cells that store data as either a set or a reset state of the memory cells; and
adaptively adjusting a preset setting used to differentiate between a set state and a reset state for a memory cell in response to detecting a change in a margin, wherein detecting the change in the margin comprises detecting a read retry rate higher than a retry rate threshold or detecting a number of bit errors greater than a bit error threshold.

19. The method of claim 18, wherein the nonvolatile memory cells comprise memory cells that store data based on a resistive state.

20. The method of claim 18, wherein the preset setting comprises a voltage trim for a demarcation voltage (Vdm), a trim value for a current setting, or a trim value for a timing setting.

21. A memory controller comprising:
a hardware interface to couple to a memory device having multiple nonvolatile memory cells that store data as either a set or a reset state of the memory cells;
control logic to periodically cause the memory device to sample set and reset margins for memory cells of the memory device, and in response to detection of a change in a margin, to adaptively adjust a preset access setting used to differentiate between a set state and a reset state for a memory cell;
wherein the control logic is to cause the memory device to sample set and reset margins in response to detection of a read retry rate higher than a retry rate threshold, or in response to detection of a number of bit errors greater than a bit error threshold; and
a register to store one or more preset access settings for the hardware interface to apply in a subsequent access to the memory controller.

22. The memory controller of claim 21, wherein the preset access setting comprises a trim value of an electrical setting for a voltage attribute, or a current attribute, or a timing attribute.

23. The memory controller of claim 21, wherein the memory device comprises a first of multiple memory devices, wherein the control logic is to periodically cause the first memory device to sample set and reset margins for memory cells of the first memory device, and to periodically cause a second of the multiple memory devices to sample set and reset margins for memory cells of the second memory device.

* * * * *